(12) United States Patent
Schwartz

(10) Patent No.: US 10,228,495 B2
(45) Date of Patent: Mar. 12, 2019

(54) APPARATUS AND METHODS OF ELECTRICALLY CONDUCTIVE OPTICAL SEMICONDUCTOR COATING

(71) Applicant: Goodrich Corporation, Charlotte, NC (US)

(72) Inventor: Bradley D. Schwartz, Brewster, NY (US)

(73) Assignee: Goodrich Corporation, Charlotte, NC (US)

( * ) Notice: Subject to any disclaimer, the term of this patent is extended or adjusted under 35 U.S.C. 154(b) by 179 days.

(21) Appl. No.: 15/259,370

(22) Filed: Sep. 8, 2016

(65) Prior Publication Data

US 2018/0067236 A1    Mar. 8, 2018

(51) Int. Cl.
| | | |
|---|---|---|
| *G02B 1/16* | (2015.01) |
| *G02B 1/14* | (2015.01) |
| *G02B 1/11* | (2015.01) |
| *H01L 23/552* | (2006.01) |
| *H01L 31/0216* | (2014.01) |
| *H01L 21/02* | (2006.01) |
| *G03F 7/32* | (2006.01) |
| *B05D 5/00* | (2006.01) |
| *B05D 5/12* | (2006.01) |

(52) U.S. Cl.
CPC ............... *G02B 1/16* (2015.01); *B05D 5/00* (2013.01); *B05D 5/12* (2013.01); *G02B 1/11* (2013.01); *G02B 1/14* (2015.01); *H01L 23/552* (2013.01); *H01L 31/0216* (2013.01); *H01L 21/02565* (2013.01)

(58) Field of Classification Search
CPC .... G02B 1/16; G02B 1/14; G02B 1/11; H01L 23/552; H01L 31/0216; H01L 21/02565; G03F 7/32; B05D 5/00; B05D 5/12
See application file for complete search history.

(56) References Cited

U.S. PATENT DOCUMENTS

| | | | |
|---|---|---|---|
| 4,152,824 A | | 5/1979 | Gonsiorawski |
| 4,255,474 A | | 3/1981 | Smith, Jr. |
| 5,114,876 A | * | 5/1992 | Weiner ............. H01L 21/02381 117/53 |

(Continued)

FOREIGN PATENT DOCUMENTS

| | | |
|---|---|---|
| CN | 105529355 A | 4/2016 |
| EP | 438398 A1 | 7/1991 |

OTHER PUBLICATIONS

P. Janicek et al., Applied Surface Science, 421, (2017) 557-564. (Year: 2017).*

(Continued)

*Primary Examiner* — James Mellott
(74) *Attorney, Agent, or Firm* — Locke Lord LLP; Joshua L. Jones; Scott D. Wofsy

(57) ABSTRACT

A method of coating an optical substrate with a transparent, electrically conductive coating includes depositing a semiconductor coating over a surface of an optical substrate. The semiconductor coating has broadband optical transmittance. Channels are formed in the semiconductor coating. The method includes coating over the semiconductor coating and filling the channels with a doped semiconductor. The doped semiconductor is removed from the semiconductor coating, leaving the doped semiconductor in the channels.

17 Claims, 2 Drawing Sheets

(56) References Cited

U.S. PATENT DOCUMENTS

| | | | |
|---|---|---|---|
| 5,173,443 A | 12/1992 | Biricik et al. | |
| 5,546,204 A * | 8/1996 | Ellis | G02F 1/1368 |
| | | | 257/59 |
| 5,993,981 A | 11/1999 | Askinazi et al. | |
| 6,521,913 B1 * | 2/2003 | Murade | G02F 1/136209 |
| | | | 257/59 |
| 7,557,769 B2 | 7/2009 | Picard et al. | |
| 9,276,034 B2 | 3/2016 | Zmek et al. | |
| 2002/0125437 A1 * | 9/2002 | Izumi | H01L 27/12 |
| | | | 250/370.01 |
| 2006/0281309 A1 | 12/2006 | Trezza | |
| 2012/0225250 A1 | 9/2012 | Kuznetsov et al. | |
| 2014/0272314 A1 | 9/2014 | Veerasamy | |
| 2016/0035756 A1 * | 2/2016 | Jiang | H01L 29/66969 |
| | | | 257/43 |

OTHER PUBLICATIONS

Extended European Search Report dated Jan. 29, 2018, issued during the prosecution of European Patent Application No. 17190056.6 (9 pages).

Communication Pursuant to Article 94(3) EPC, dated Dec. 12, 2018, issued in corresponding European Patent Application No. 17190056.6.

* cited by examiner

APPARATUS AND METHODS OF ELECTRICALLY CONDUCTIVE OPTICAL SEMICONDUCTOR COATING

BACKGROUND OF THE INVENTION

1. Field of the Invention

The present disclosure relates to optics, and more particularly to electrically conductive coatings for broadband optics.

2. Description of Related Art

Electro-optic (EO) systems require windows to protect the sensor and electronics from outside elements. In addition to rain, dust, and the like, in many cases the window must also block electromagnetic interference (EMI) that would otherwise impede the EO system performance.

EMI shielding can be accomplished with a window that is electrically conductive and optically transparent. There are three conventional types of shielding.

The first type of EMI shielded window uses a semiconductor material such as silicon or germanium that is doped with a group V element such as phosphorous, arsine, or antimony to supply additional electrons to provide electrical conductivity. These windows are opaque for visible wavelengths and are thus not useful for broadband EO systems.

The second type of shielded window uses a continuous, transparent, conductive coating. These coatings consist of wide bandgap semiconductors such as indium oxide ($In_2O_3$) and zinc oxide (ZnO) that have broadband optical transparency. The semiconductors are doped to provide electrical conductivity. However, as doping increases to increase electrical conductivity and EMI attenuation, optical transmittance decreases. This effect begins at longer wavelengths where both plasma reflectance and free-carrier absorption from electrons decrease transmittance. Traditional transparent, conductive semiconductor coatings are practical only in the 0.4 to 2.0 micron range, short wavelength visible through short wavelength infrared, (SWIR).

The third type of shielded window is traditionally required for broadband applications from the visible to the long-wave infrared (LWIR). A grid of fine metal lines is applied on the surface of the window. Typical dimensions are 5-micron wide lines with 140 micron spacing. These gridded windows enable optical transmittance over a broad wavelength range, but they limit optical transmittance by obscuration and scattering.

U.S. Pat. No. 9,276,034 presents a method for reducing the optical scattering from a conductive grid. Channels are etched into a window substrate, and an electrically conductive semiconductor is deposited in the channels such that the surface of the window is planar. The semiconductor is transparent for visible and short wavelength infrared (SWIR) wavelengths but reflecting and absorbing for mid wavelength infrared (MWIR) and longer wavelengths. Using a semiconductor with an index of refraction close to that of the substrate minimizes light scattering from the grid lines.

The conventional techniques have been considered satisfactory for their intended purpose. However, there is an ever present need for improved electrically conductive optical coatings for broad band optics. This disclosure provides a solution for this problem.

SUMMARY OF THE INVENTION

A method of coating an optical substrate includes depositing a semiconductor coating over a surface of an optical substrate. The semiconductor coating has broadband optical transmittance. Channels are formed in the semiconductor coating. The method includes coating over the semiconductor coating and at least partially filling the channels with an electrically conductive doped semiconductor. The doped semiconductor is removed from the semiconductor coating, leaving at least some of the doped semiconductor in the channels.

Forming channels can include applying a photoresist over the semiconductor coating. The photoresist can be selectively exposed and developed in a pattern. The semiconductor coating can be etched in the pattern. The photoresist can be removed to leave the channels in the pattern on the semiconductor coating. Forming the channels can include etching the channels using at least one of chemical etching, reactive ion etching, or ion beam milling.

Coating over the semiconductor coating with doped semiconductor can include applying the doped semiconductor by thin film coating. The pattern can be configured to provide electromagnetic interference (EMI) shielding to the optical substrate. The pattern can include a grid. Removing the doped semiconductor from the semiconductor coating can include polishing to form a planar surface on the semiconductor coating and doped semiconductor in the channels.

A protective coating can be applied over the semiconductor coating and doped semiconductor in the channels. The method can include depositing a broadband anti-reflection coating over the protective coating. It is also contemplated that the method can include depositing a broadband anti-reflection coating, e.g., directly, over the semiconductor coating and doped semiconductor in the channels.

The semiconductor coating can include at least one of $In_2O_3$ or ZnO. The doped semiconductor can include at least one of Sn, Mo, W, or Ti, e.g., for $In_2O_3$, or Al, or Ga, e.g., for ZnO. The undoped semiconductor coating can have broadband optical transmittance in at least short wavelength visible to long wavelength infrared (LWIR) spectra. Depositing the semiconductor coating can include depositing the semiconductor coating with the semiconductor coating undoped.

Depositing a semiconductor coating can include depositing the semiconductor coating over a surface of the optical substrate in its entirety. Forming channels and leaving at least some of the doped semiconductor in the channels can include forming the pattern so a surface of the semiconductor coating is covered in its entirety with the pattern.

The doped semiconductor, semiconductor coating, and optical substrate can be formed into a window without patterning or etching the optical substrate. The doped semiconductor and semiconductor coating can have closely matched indices of refraction to mitigate light scattering. A window can be produced by any embodiment of the processes described above. A window can include a transparent substrate with a transparent semiconductor coating having channels filled with a doped semiconductor.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
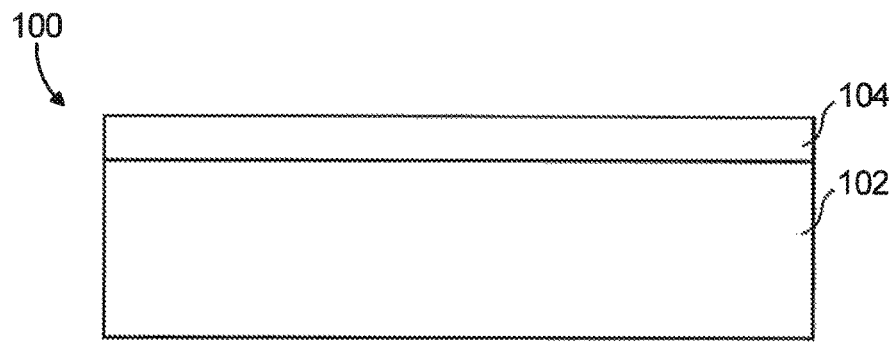
FIG. 1 is a schematic cross-sectional elevation view of an exemplary embodiment of an optic constructed in accordance with the subject disclosure, showing the semiconductor coating with broadband optical transmittance deposited over the surface of the optical substrate.

Reference will now be made to the drawings wherein like reference numerals identify similar structural features or aspects of the subject disclosure. For purposes of explanation and illustration, and not limitation, a partial view of an exemplary embodiment of an optic in accordance with the disclosure is shown in FIG. 1 and is designated generally by reference character 100. Other embodiments of optics in accordance with the disclosure, or aspects thereof, are provided in FIGS. 2-6, as will be described. The systems and methods described herein can be used to provide electrically conductive coatings on optics such as windows, wherein the coatings have broadband optical transmittance.

A method of coating an optical substrate 102 with a transparent, electrically conductive coating includes depositing a semiconductor coating 104 over a surface of an optical substrate 102. The semiconductor coating 104 has broadband optical transmittance. The semiconductor coating 104 can include at least one of Indium Oxide ($In_2O_3$) or Zinc Oxide (ZnO). Those skilled in the art will readily appreciate that any other suitable type of semiconductor material can be used, or alloys thereof, without departing from the scope of this disclosure. The semiconductor coating 104 can have broadband optical transmittance in at least visible and infrared spectra such as long wave infrared, for example. Depositing the semiconductor coating 104 can include depositing the semiconductor coating with the semiconductor coating undoped. Depositing the semiconductor coating 104 can include depositing the semiconductor coating over a surface of the optical substrate 102 in its entirety, e.g., the top surface of optical substrate 102 as oriented in FIG. 1.

Figure 2:
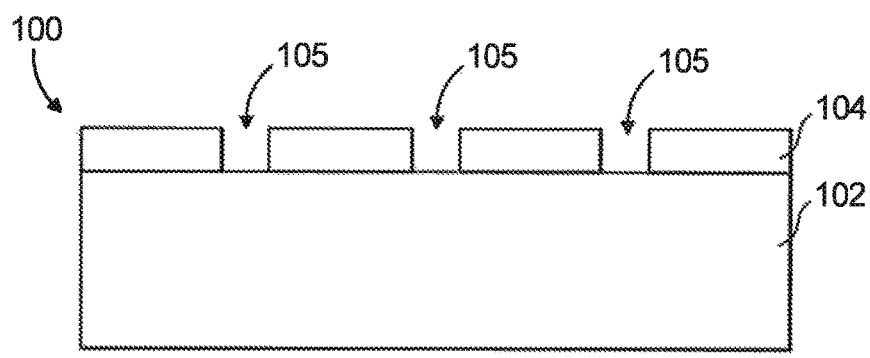
FIG. 2 is a schematic cross-sectional elevation view of the optic of FIG. 1, showing channels defined in a pattern in the semiconductor coating.
Figure 3:
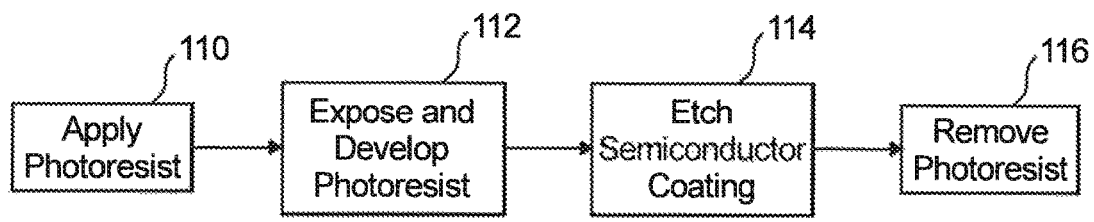
FIG. 3 is a flow diagram of an exemplary embodiment of a process in accordance with the subject disclosure, showing a process for making channels in a semiconductor coating.
Figure 6:
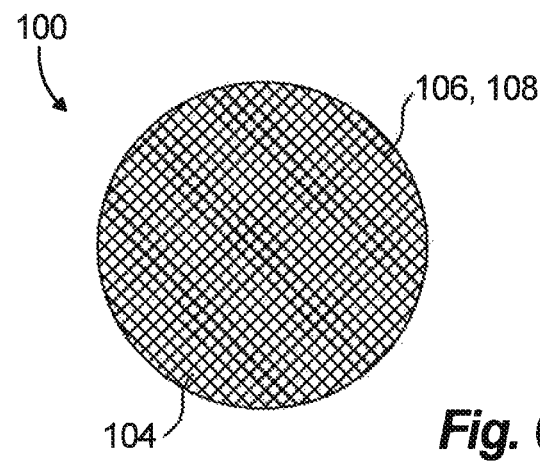
FIG. 6 is a schematic plan view of the optical substrate in FIG. 1, showing an exemplary grid pattern.

As shown in FIG. 2, channels 105 are formed in a pattern 108, shown in FIG. 6, in the semiconductor coating 104. Referring to FIG. 3, forming channels 105 in a pattern 108 can include applying a photoresist over the semiconductor coating 104, as indicated with box 110 in FIG. 3. The photoresist can be selectively exposed and developed in the pattern 108, as indicated with box 112. The semiconductor coating 104 can then be etched in the pattern 108, as indicated with box 114. The photoresist can then be removed to leave the channels 105 in the pattern 108 on the semiconductor coating 104, as indicated with box 116. Forming the channels 105 can include etching the channels using at least one of chemical etching, reactive ion etching, or ion beam milling.

Figure 4:
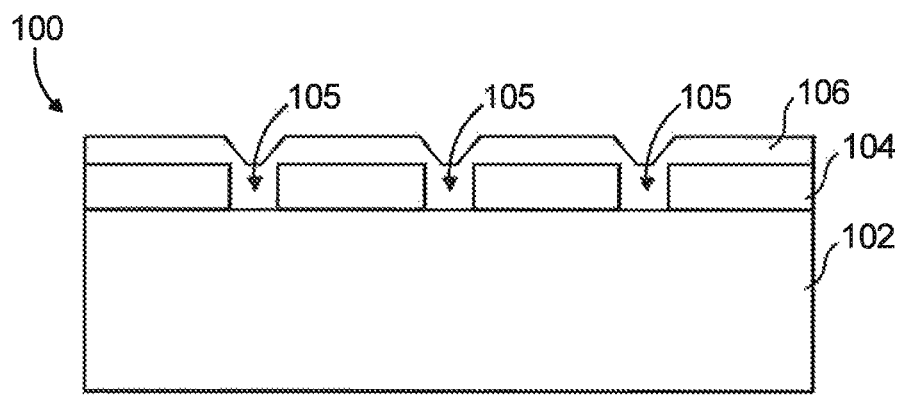
FIG. 4 is a schematic cross-sectional elevation view of the optic of FIG. 1, showing the doped semiconductor coated on the semiconductor coating and in the channels.

As shown in FIG. 4, the method includes coating over the semiconductor coating 102 and filling the channels 105 with a doped semiconductor 106. Coating over the semiconductor coating 102 with doped semiconductor 106 can include at least one of applying the doped semiconductor 106 by thin film coating, or by any other suitable process. The doped semiconductor can include at least one of Sn, Mo, W, Ti, Al, Ga, or any other suitable material for electrical conductivity. For example, if the semiconductor coating 104 includes undoped $In_2O_3$, the doped semiconductor 106 can include $In_2O_3$ doped with Sn, Mo, W, or Ti. In another example, if the semiconductor coating 104 includes undoped ZnO, the doped semiconductor 106 can include ZnO doped with Al or Ga.

Figure 5:
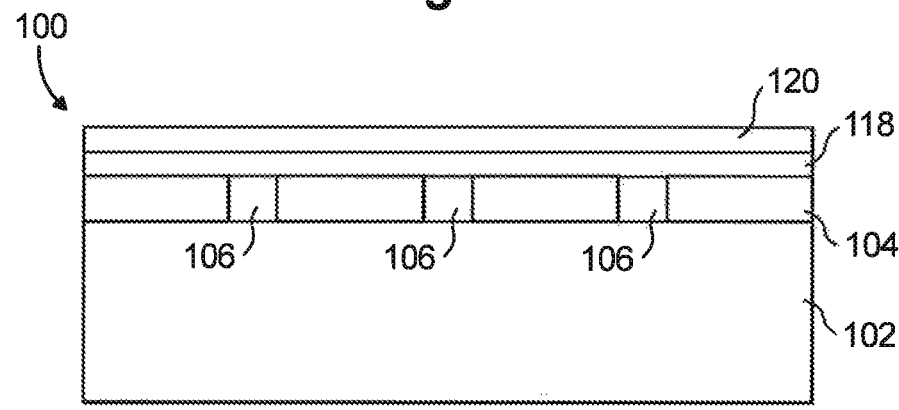
FIG. 5 is a schematic cross-sectional elevation view of the optic of FIG. 1, showing the doped semiconductor removed from the semiconductor coating, but remaining in the channels.

Referring now to FIG. 5, the doped semiconductor 106 is removed from the semiconductor coating 102, leaving the doped semiconductor 106 in the channels 105. Removing doped semiconductor 106 form the semiconductor coating 104 includes polishing to form a planar surface on the semiconductor coating 104 and doped semiconductor 106 in the channels 105, as shown in FIG. 5. This forms a grid pattern 108, shown in FIG. 6, of doped semiconductor 106 in the semiconductor coating 102. The doped semiconductor does not need to be activated if it is conductive upon application. Polishing is one example of a technique to provide a planar final surface. Another example is to coat over the patterned photoresist with the doped semiconductor and then lift off the doped semiconductor by removing, e.g., dissolving, the photoresist.

Referring now to FIG. 6, the pattern 108 of doped semiconductor 106 can be configured to provide electromagnetic interference (EMI) shielding to the optical substrate, e.g., in any suitable grid pattern. For example, for EMI shielding a broadband optic with a grid having optical transmittance in visible and long wave infrared, a square grid with 5-micron wide lines with 140 micron spacing between the grid lines can be used. Forming channels 105 and leaving the doped semiconductor 106 in the channels 105 can include applying the doped semiconductor 106 to a surface of the semiconductor coating 104 so that surface of the semiconductor coating 104 is covered in its entirety with the pattern as shown in FIG. 6. The grid pattern 108 shown in FIG. 6 is schematic and is not necessarily to scale.

With reference again to FIG. 5, a protective coating 118 can be applied over the semiconductor coating 104 and doped semiconductor 106 that remains in the channels 105. The method can include depositing a broadband anti-reflection coating 120 over the protective coating 118. It is also contemplated that a broadband anti-reflection coating 120 can be applied directly over the semiconductor coating 104 and doped semiconductor 106, e.g., omitting protective coating 118. Although illustrated as a single layer, the broadband anti-reflection coating can consist of multiple layers.

The doped semiconductor 106, semiconductor coating 104, and optical substrate 102 can be formed into an optic 100, e.g., a window, that has an electrically conductive coating for EMI shielding, heating, or the like, without patterning or etching the optical substrate 102 itself. This can be advantageous, as it allows for a single etching process to be used, independent of what material is used for optical substrate 102. The doped semiconductor 106 and semiconductor coating 104 have closely matched indices of refraction to mitigate visible and near infrared light scattering through the grid pattern. If the ratio of the indices of refraction of the doped semiconductor and semiconductor coating is between 0.82 and 1.22, the interface reflection will be less than 1% at normal incidence. For example, the indices of refraction of doped and undoped In2O3 at 632.8 nm are about 2.00 and 1.77, respectively. The index ratio of 1.13 produces a reflection of only 0.37%.

Those skilled in the art will readily appreciate that while shown and described above in the exemplary context of first depositing the undoped semiconductor coating, etching channels therein, and depositing the doped semiconductor in the channels, the layer order of the doped and undoped semiconductor can be reversed. In this example, the optical substrate 102 is covered with a doped semiconductor, e.g., with low resistivity. Channels are etched in the doped semiconductor coating leaving a conductive grid pattern. The channels are filled with a semiconductor with broadband optical transmission, and the surface can be finished as described above.

Those skilled in the art will readily appreciate that doped and undoped semiconductors as described herein are doped and undoped relative to one another. In other words, doped semiconductors described herein are doped to have enhanced electrical conductivity relative to the respective undoped semiconductors described herein. The undoped semiconductors as described herein need not be free of all other dopants.

The methods and systems of the present disclosure, as described above and shown in the drawings, provide for electrically conductive coatings with superior properties including broadband optical transmittance. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A method of coating an optical substrate, comprising:
   depositing a semiconductor coating over a surface of the optical substrate, wherein the semiconductor coating has broadband optical transmittance in at least visible and infrared spectra;
   forming channels in the semiconductor coating;
   coating over the semiconductor coating and at least partially filling the channels with an electrically conductive doped semiconductor; and
   removing at least some of the doped semiconductor from the semiconductor coating, leaving at least some of the doped semiconductor in the channels to form a pattern of doped semiconductor configured to provide electromagnetic interference (EMI) shielding to the optical substrate.

2. A method as recited in claim 1, wherein forming channels includes:
   applying a photoresist over the semiconductor coating;
   selectively exposing the photoresist and developing the photoresist in the pattern;
   etching the semiconductor coating in the pattern; and
   removing the photoresist to leave the channels in the pattern on the semiconductor coating.

3. A method as recited in claim 2, wherein the pattern includes a grid.

4. A method as recited in claim 1, further comprising applying a protective coating over the semiconductor coating and doped semiconductor in the channels.

5. A method as recited in claim 4, further comprising depositing a broadband anti-reflection coating over the protective coating.

6. A method as recited in claim 1, further comprising depositing a broadband anti-reflection coating over the semiconductor coating and doped semiconductor in the channels.

7. A method as recited in claim 1, wherein forming the channels includes etching the channels using at least one of chemical etching, reactive ion etching, or ion beam milling.

8. A method as recited in claim 1, wherein the semiconductor coating includes at least one of $In_2O_3$ or ZnO.

9. A method as recited in claim 1, wherein coating over the semiconductor coating with doped semiconductor includes at least one of applying the doped semiconductor by thin film coating.

10. A method as recited in claim 1, wherein the doped semiconductor includes at least one of Sn, Mo, W, Ti, Al, or Ga.

11. A method as recited in claim 1, wherein depositing the semiconductor coating includes depositing the semiconductor coating with the semiconductor coating undoped.

12. A method as recited in claim 1, wherein removing doped semiconductor from the semiconductor coating includes polishing to form a planar surface on the semiconductor coating and leaving doped semiconductor in the channels.

13. A method as recited in claim 1, wherein depositing a semiconductor coating includes depositing the semiconductor coating over a surface of the optical substrate in its entirety.

14. A method as recited in claim 1, wherein forming channels and leaving the doped semiconductor in the channels includes forming a pattern so a surface of the semiconductor coating is covered in its entirety with the pattern.

15. A method as recited in claim 1, wherein the doped semiconductor, semiconductor coating, and optical substrate are formed into a window without patterning or etching the optical substrate.

16. A method as recited in claim 1, wherein the doped semiconductor and semiconductor coating have closely matched indices of refraction to mitigate light scattering.

17. A method of coating an optical substrate, comprising:
   depositing a doped semiconductor coating over a surface of the optical substrate, wherein the doped semiconductor coating has broadband optical transmittance in at least visible and infrared spectra;
   forming channels in the doped semiconductor coating;
   coating over the doped semiconductor coating and at least partially filling the channels with an undoped semiconductor; and
   removing at least some of the undoped semiconductor from the doped semiconductor coating, leaving at least some of the undoped semiconductor in the channels to form a pattern of doped semiconductor configured to provide electromagnetic interference (EMI) shielding to the optical substrate.

* * * * *